US007558334B2

(12) United States Patent
McCune et al.

(10) Patent No.: US 7,558,334 B2
(45) Date of Patent: Jul. 7, 2009

(54) ENHANCED HYBRID CLASS-S MODULATOR

(75) Inventors: Earl W. McCune, Santa Clara, CA (US); Bojan Silic, San Jose, CA (US)

(73) Assignee: Panasonic Corporation, Osaka (JP)

( * ) Notice: Subject to any disclaimer, the term of this patent is extended or adjusted under 35 U.S.C. 154(b) by 110 days.

(21) Appl. No.: 11/515,250

(22) Filed: Sep. 1, 2006

(65) Prior Publication Data

US 2008/0074207 A1    Mar. 27, 2008

(51) Int. Cl.
H04K 1/02 (2006.01)
(52) U.S. Cl. .................... 375/297; 332/159; 332/149
(58) Field of Classification Search ............ 332/149, 332/150, 159, 160, 178, 145; 375/268, 300; 455/108; 330/10, 207 A, 251
See application file for complete search history.

(56) References Cited

U.S. PATENT DOCUMENTS

| 4,689,802 | A | * | 8/1987 | McCambridge ............ 375/238 |
| 5,838,193 | A | * | 11/1998 | Myers et al. ................ 330/10 |
| 6,313,622 | B1 | * | 11/2001 | Seki et al. ................ 324/76.82 |
| 6,369,649 | B2 | * | 4/2002 | Nakajima ..................... 330/51 |
| 6,707,463 | B1 | * | 3/2004 | Gibson et al. ............... 345/619 |
| 2002/0093442 | A1 | * | 7/2002 | Gupta ......................... 341/143 |
| 2004/0240583 | A1 | * | 12/2004 | Rauh et al. .................. 375/297 |
| 2005/0270813 | A1 | * | 12/2005 | Zhang et al. .................. 363/89 |

OTHER PUBLICATIONS

Frederick H. Raab, Ph D. et al, Class-S High-Efficiency Amplitude Modulator, RF design, May 1994, 5 pages, vol. 17, No. 5, Argus Business, Atlanta, GA, USA.

Frederick H. Raab, et al, RF and Microwave Power Amplifier and Transmitter Technologies-Part 3, High Frequency Electronics, Sep. 2003, 10 pages, Summit Technical Media, LLC.

Angel V. Peterchev, et al, Quantization Resolution and Limit Cycling in Digitally Controlled PWM Converters, IEEE, Jan. 2003, 8 pages, vol. 18, No. 1, IEEE.

Wendell B. Sander, et al, Polar Modulator for Multi-mode Cell phones, IEEE, Sep. 2003, 6 pages, Vol., Issue, 21-24, IEEE.

Narisi Wang, et al, Linearity of X-Band Class-E Power Amplifiers in EER Operation, IEEE, Mar. 2005, 7 pages, vol. 53, No. 3, IEEE.

Gary Hanington, et al, High-Efficiency Power Amplifier Using Dynamic Power-Supply Voltage for CDMA Applications, IEEE, Aug. 1999, 6 pages, vol. 47, No. 8, IEEE.

* cited by examiner

*Primary Examiner*—Robert Pascal
*Assistant Examiner*—Ryan J. Johnson

(57) ABSTRACT

A hybrid modulator apparatus includes a modulator that amplitude modulates a power supply signal. A correction circuit coupled in parallel with the modulator reduces errors caused by the modulator. In one embodiment the modulator includes a digital pulse-width modulator (PWM) and a buck converter. The K most significant bits (MSBs) of N-bit input digital words are used by the digital PWM and a buck converter to generate an amplitude modulated power supply signal having a plurality of quantized voltage levels. The remaining N-K bits of each N-bit words may be used to dither the input drive to the PMW, to produce an error signal at the output of the modulator representing quantization errors caused by only applying the K MSBs to the PWM. The correction circuit compares the error signal to a signal formed form all N bits of the N-bit words in reducing the quantization errors.

48 Claims, 13 Drawing Sheets

1900

ENHANCED HYBRID CLASS-S MODULATOR

FIELD OF THE INVENTION

The present invention relates generally to radio frequency (RF) transmitters. More specifically, the present invention relates to highly-efficient hybrid class-S modulators for RF transmitters.

BACKGROUND OF THE INVENTION

Conventional wireless communication transmitters typically employ a quadrature modulator (also referred to as an "I/Q" modulator) to modulate two orthogonal baseband data streams—an in-phase data stream and a quadrature-phase data stream—onto a radio frequency (RF) carrier. FIG. 1 is a block diagram of a prior art quadrature modulator 10. The quadrature modulator 1 comprises an I-channel mixer 10, a Q-channel mixer 12, a local oscillator (LO) 14, a phase shifter 16 and a summer 17. The I-channel mixer 10 is configured to receive the in-phase data stream and a radio frequency (RF) carrier signal from the LO 14. At the same time, the Q-channel mixer 12 is configured to receive the quadrature-phase data stream and a ninety-degree phase shifted version of the carrier signal, by operation of the ninety-degree phase shifter 16. The I- and Q-channel mixers 10 and 12 upconvert both the in-phase and quadrature-phase data streams to the frequency of the RF carrier. The summer 17 combines the upconverted in-phase and quadrature-phase signals and feeds the sum to an input of an RF power amplifier (RFPA) 18. The RFPA 18 amplifies the upconverted sum and feeds the upconverted sum to an antenna 19, which radiates the modulated RF carrier for reception by an RF receiver.

A significant drawback of the I/Q modulator is that it is not very power efficient, especially when used to condition and transmit non-constant-envelope signals such as EDGE (Enhanced Data Rates for GSM (Global System for Mobile Communications) Evolution) and W-CDMA (Wideband Code Division Multiple Access). To minimize distortion of the signal peaks when conditioning and transmitting such signals, the drive levels to the RFPA must be reduced to prevent signal clipping, and the RFPA must be configured to amplify in a linear mode of operation. Unfortunately, linear power amplifiers are not particularly efficient.

A polar modulator is a type of modulator that avoids the linearity requirement of the RFPA and, because so, is considerably more efficient than the conventional I/Q modulator. FIG. 2 is a block diagram illustrating the principle components of a typical prior art polar modulator 2. The polar modulator 2 comprises a rectangular-to-polar converter 20; an amplitude modulator 22 configured within a magnitude path of the modulator 2; and a phase modulator 24 and voltage controlled oscillator (VCO) 26 configured within a phase path of the modulator 2.

The rectangular-to-polar converter 20 converts I and Q baseband data streams into separate magnitude and phase paths. The amplitude modulator 22 receives the amplitude data $\rho(t)$ in the magnitude path and modulates a power supply voltage (Vsupply) according to the amplitude of $\rho(t)$. The phase modulator 24 receives the constant-amplitude phase data $d\phi/dt$ in the phase path, and drives the voltage controlled oscillator (VCO) 26 to provide an RF drive signal to the RFPA 28.

The RFPA 28 in the polar modulator 2 in FIG. 2 is configured as a highly-efficient nonlinear switched-mode RFPA. The RFPA 28 remains in compression while the drain voltage of the RFPA 28 is varied. By modulating the drain supply, the amplitude information of non-constant envelope signals such as EDGE and W-CDMA can be efficiently superimposed on the RF signal from the phase path of the modulator 2.

The amplitude modulator 22 in the amplitude path of the polar modulator 2 may be formed in various ways. One known approach is to use a class-S amplitude modulator 30 to modulate the drain supply to the RFPA 32 of the polar modulator, as shown in the polar modulator 3 depicted in FIG. 3. Class-S modulators are more efficient than conventional linear modulators and, when configured for amplitude modulation in the magnitude path of a polar modulator, provide a highly-efficient means for modulating an RF carrier. Further, because the class-S modulator 30 is configured within the magnitude path of the polar modulator 3, and the drive signal to the RFPA 32 is a constant-magnitude phase modulated signal within the phase path of the polar modulator 3, distortion caused by the clipping of signal peaks in non-constant envelope signals, such as EDGE and W-CDMA, can be avoided.

A more detailed view of a class-S modulator 4 is shown in FIG. 4. The class-S modulator 4 comprises a comparator 40, a level shifter and gate driver 41, and a buck converter that includes a switching transistor 42, a diode 43, an inductor 44 and a capacitor 45. When configured in the amplitude path of a polar modulator, the amplitude values in the amplitude path are compared to a triangular reference signal to produce a pulse-width-modulated (PWM) signal. The resulting PWM signal is comprised of a series of pulses having durations that vary in proportion to the amplitude values at the comparator input.

Together, the switching transistor 42 and diode 43 in the buck converter portion of the class-S modulator act as a single-pole double-throw (SPDT) switch. Current flows through switching transistor 42 when it is ON and through diode 43 when transistor 42 is OFF. Switching the buck converter with the PWM signal from the driver generates a high-level PWM signal. The high-level PWM signal is converted back into an analog signal by the low-pass output filter formed by the inductor 44 and the capacitor 45.

Accurate envelope tracking of the amplitude signal requires that the switching frequency of the buck converter be about twenty to fifty times higher than the required signal envelope bandwidth. For a signal such as EDGE, the envelope bandwidth is approximately 1 MHz. This means that for EDGE type signals, the transistor in the buck converter would have to be capable of switching at a rate of 20-50 MHz rate. Unfortunately, the switching transistor (typically a silicon-based MOSFET (Metal-Oxide-Semiconductor Field Effect Transistor) or BJT (Bipolar Junction Transistor)) in state-of-the-art buck converters can only be switched up to a maximum of about 5 MHz. For this reason, conventional class-S modulators are not well-suited for EDGE and other non-constant envelope signals that have high signal envelope bandwidths.

What is needed, therefore, is a modulator circuit for a polar modulator that has an efficiency similar to or better than a conventional class-S modulator, and which is capable of transmitting and conditioning non-constant envelope signals such as EDGE and W-CDMA, while satisfying power spectra requirements specified by these standards.

SUMMARY OF THE INVENTION

Highly-efficient hybrid class-S modulators for polar modulators are disclosed. According to an aspect of the present invention, a hybrid modulator circuit includes a modulator that is operable to modulate a power supply voltage according to amplitude characteristics of an input signal. The modulator generates a modulated power supply voltage signal at an output of the modulator. A correction circuit coupled to the modulator is configured to generate signals to reduce deviations of the modulated power supply voltage signal levels from desired voltage levels. The correction circuit may contain an operational amplifier which is operable to source or sink current to or from the output node of the modulator when the voltage levels of the modulated supply voltage signal are less than or greater than the desired voltage levels. The modulator may also contain a digital pulse-width modulator (PWM) generator that receives digital data and generates a discrete set of PWM signals that drive a buck converter, thereby providing a modulated power supply voltage signal having a plurality of quantized voltage levels. In accordance with this particular aspect of the invention, the circuit coupled to the modulator sources or sinks current to or from the output node of the modulator circuit when a magnitude of a quantized level of said plurality of quantized levels is less than or greater than a desired magnitude.

According to yet another aspect of the invention, a modulator circuit has an input port configured to receive a succession of N-bit digital words, where N is an integer that is greater than one. The modulator circuit also includes a modulator that is operable to modulate a power supply voltage according to values represented by the K most significant bits of each N-bit digital word, where K is a positive integer that is less than N. An output port of the modulator circuit is adapted to provide a modulated power supply voltage signal. The modulator circuit further includes a circuit coupled to the modulator that is operable to reduce deviations of voltage levels of the modulated power supply voltage signal from desired voltage levels. In accordance with this aspect of the invention, the modulator may include a pulse-width modulator (PWM) generator configured to receive the K most significant bits of each N-bit digital word and generate a modulated power supply voltage signal having a plurality of quantized voltage levels depending on pulse widths of PWM signals generated by the PWM generator. The deviation of voltage levels of the modulated power supply voltage signal from desired voltage levels may depend, at least in part, on the difference in value of an N-bit word received at the input port and the value of the K most significant bits of the N-bit word applied to PWM generator.

According to a related aspect of the invention, an error generated by using only K of the N bits of each N-bit word applied to the PWM is reduced by dithering the input drive and converting the error to an AC signal. According to this aspect of the invention, the N-K least significant bits (LSBs) of each N-bit input word are fed to an input of a digital oscillator, while the K most significant bits (MSBs) of each word are fed to the PWM generator. The N-K LSBs of each N-bit word represent the error resulting from using only K of the N bits at the PWM generator. The digital oscillator converts the N-K LSBs of each input word into an oscillating single LSB. The effect of dithering the input drive in this manner results in an AC error signal appearing at the output of the modulator. This oscillating error signal is fed to the inverting input of the op-amp. At the same time, the desired output voltage, which is represented by the full N bits of the N-bit input words, is coupled to the non-inverting input of the op-amp. The op-amp responds to these input signals by sourcing or sinking current into or out of the modulator output terminal, thereby removing the error attributable to using only K of the N bits at the PWM generator.

Other features and advantages of the present invention will be understood upon reading and understanding the detailed description of the preferred exemplary embodiments, found hereinbelow, in conjunction with reference to the drawings, a brief description of which are provided below.

DETAILED DESCRIPTION

Those of ordinary skill in the art will realize that the following detailed description of the present invention is illustrative only and is not intended to be in any way limiting.

Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 5:
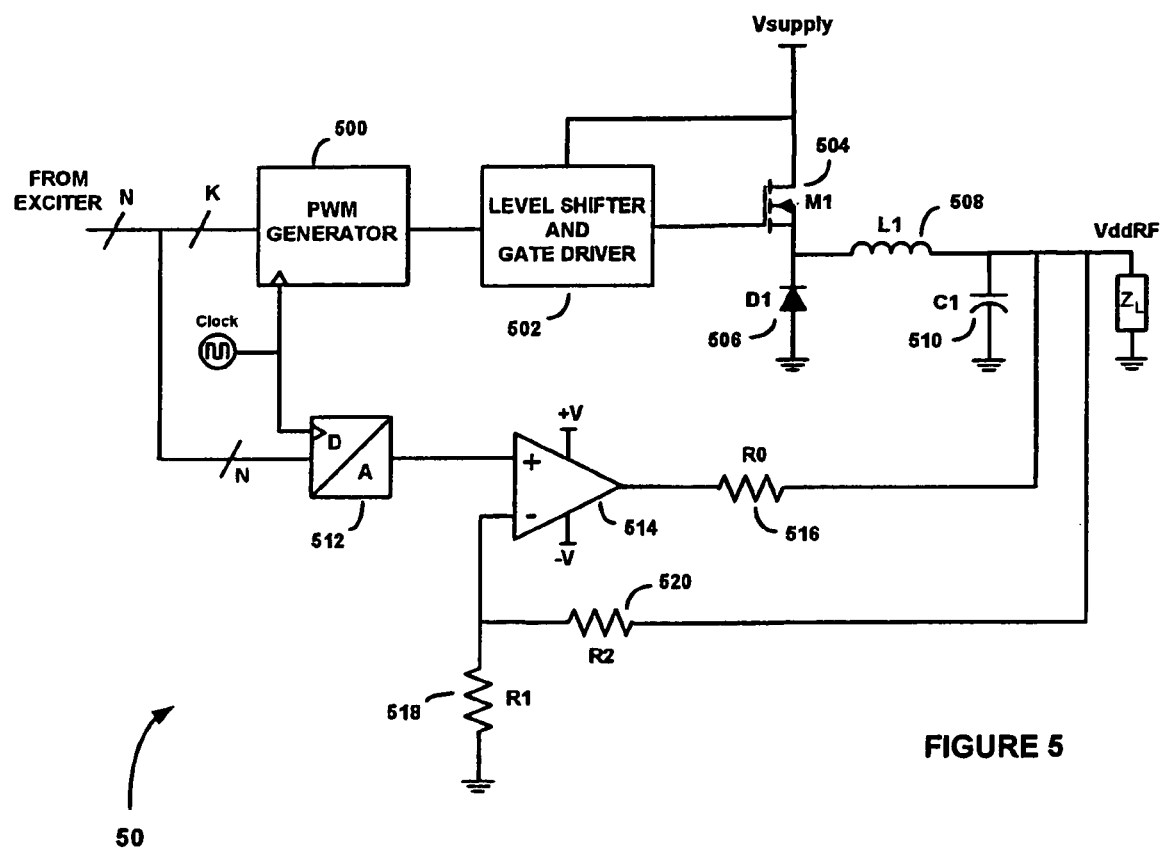
FIG. 5 is a diagram of a hybrid class-S modulator, according to an embodiment of the present invention.

Referring first to FIG. 5, there is shown a diagram of a hybrid class-S modulator 50, according to an embodiment of the present invention. The hybrid class-S modulator 50 comprises a modulator path and a feed-forward path. The modulator path includes a pulse-width modulator (PWM) generator 500, a level shifter and gate driver 502, and a buck converter that includes a switching transistor 504, a diode 506, an inductor 508 and a capacitor 510. According to this exemplary embodiment, the PWM generator 500 comprises a digital signal processor (DSP) implemented in a field-programmable gate array (FPGA). Those of ordinary skill in the art will readily appreciate and understand that, while the DSP is described in the exemplary embodiment as being implemented in an FPGA, in alternative embodiment the process performed by the DSP could be implemented as software, as firmware, as other hardware (e.g. an application specific integrated circuit (ASIC)), or as any combination of these implementations.

The ability to implement a totally digital PWM generator follows from the ability of the class-S modulator to be driven by a digital (i.e. ON/OFF) signal. Hence, an added benefit of the completely digital PWM generator is that any nonlinear affects caused by the triangular reference and/or comparator in the conventional class-S modulator (see FIG. 4) are avoided. The digital implementation is also more immune to noise, which in an analog implementation can sometimes cause the comparator to trigger when it is not desired.

As described above, the hybrid class-S modulator 50 comprises a modulator path and a feed-forward path. The feed-forward path comprises a digital-to-analog converter (DAC) 512, an amplifier (e.g., an operational amplifier ("op-amp")) 514 having inverting (−) and non-inverting (+) inputs. The desired output voltage represented by the full N bits of the N-bit words (N represents a positive integer) applied to the modulator input is fed forward to the non-inverting input of the op-amp 514, via the DAC 512. A first resistor 516 is coupled between the output of the op-amp 514 and the output of the modulator 50. A second resistor 518 is coupled between the inverting input of the op-amp 514 and ground. A third resistor 520 is coupled between the inverting input of the op-amp 514 and the modulator output.

N-bit digital input words are successively clocked into the DAC 512 in the feed-forward path of the modulator 50 while the upper significant K bits (K<N) of each N-bit word are fed to the input of the PWM generator 500. Not all N bits of each N-bit word are fed to the PWM generator 500 since cost and size constraints limit the PWM generator 500 to a processing resolution that is less than the full N-bit resolution. Accordingly, only the K most significant bits of each N-bit word are fed to the PWM generator 500.

The PWM generator 500 is capable of varying the voltage of the buck converter in increments of $Vsupply/(2^K)$. According to an exemplary embodiment, N=14, K=7, Vsupply=26 V and fclk=416 MHz. With these parameters, one-hundred twenty-eight (128) discrete PWM signals can be generated by the PWM generator 500. Hence, the buck converter portion of the modulator is capable of generating voltages in increments of $26/(2^7)$ V, or approximately 200 mV. Further, with fclk=416 MHz and 128 discrete PWM signal variations, the switching transistor 504 has a switching frequency of 3.25 MHz (Fsw=Fclk/128), which is well within the range of switching frequencies offered by state-of-the-art converters.

Because only K of the N total bits of the N-bit words applied to the class-S modulator 50 are used to generate the PWM signals, the output voltage produced for each K-bit word deviates from the full N-bit word value. This error appears as ripple at the out put of the modulator. According to an embodiment of the present invention the feed-forward circuit in FIG. 5 is employed to reduce the ripple of the modulator output voltage waveform, as will now be described.

A class-S modulator operates essentially as a voltage source and its DC output impedance is close to zero ohms. However, its AC output impedance is relatively high for frequencies close to and above the cutoff frequency of its LPF (inductor 508 and capacitor 510). The ripple frequency of the error produced at the modulator output falls into this frequency band. To reduce or remove this error, the op-amp 514 in the feed-forward path of the hybrid class-S modulator 50 is engaged to either source or sink current into or out of the modulator output node, whenever the instantaneous voltage at the modulator output is between the discrete voltage levels provided by the digital PWM generator 500. In other words, while the hybrid class-S modulator is providing the output waveform in $Vsupply/(2^K)$ increments, the parallel connected op-amp 514 "pushes" or "pulls" the output voltage to voltage levels in between in an interpolative manner. The result is an output waveform having substantially less ripple than the conventional class-S modulator 4 of FIG. 4.

Figure 6:
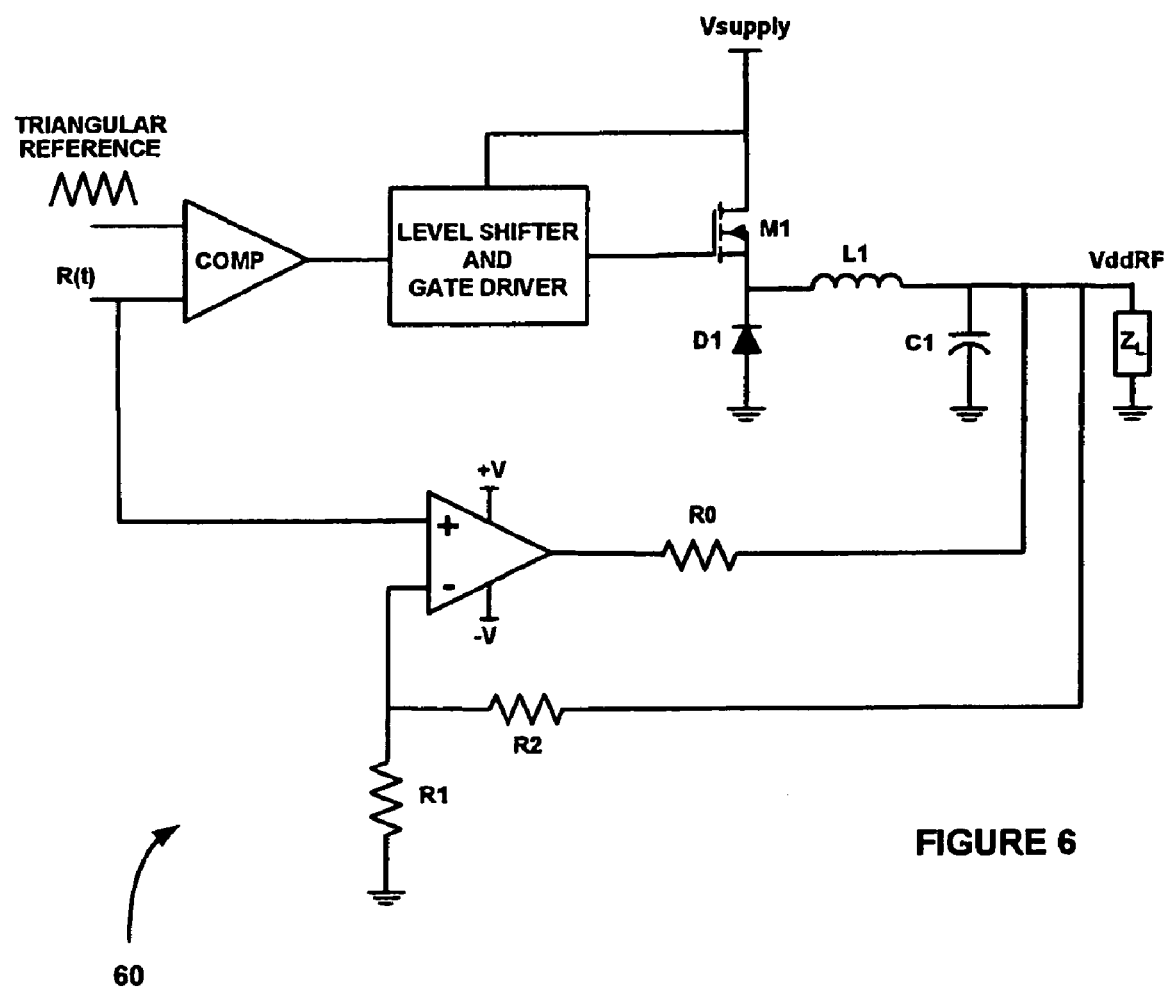
FIG. 6 is a diagram of a hybrid class-S modulator having an analog pulse-width modulator, according to an alternative embodiment of the present invention.

Whereas a digital PWM has been described as being used in the exemplary hybrid class-S modulator 50 in FIG. 5, those of ordinary skill in the art will readily appreciate and understand that a similar feed-forward ripple reducing circuit could be used with an analog PWM. An exemplary hybrid class-S modulator 60 having an analog PWM and feed-forward ripple reducing circuit is shown in FIG. 6. Operation with the analog PWM version of the class-S modulator in FIG. 6 is similar to the digital PWM in FIG. 5, except that the op-amp 514 engages whenever the instantaneous modulator output voltage VddRF is less than or greater than the "ideal" analog output voltage, rather than being engaged when the modulator output voltage is between the "ideal" quantized output values generated by the digital PWM in the embodiment shown in FIG. 5.

Figure 7:
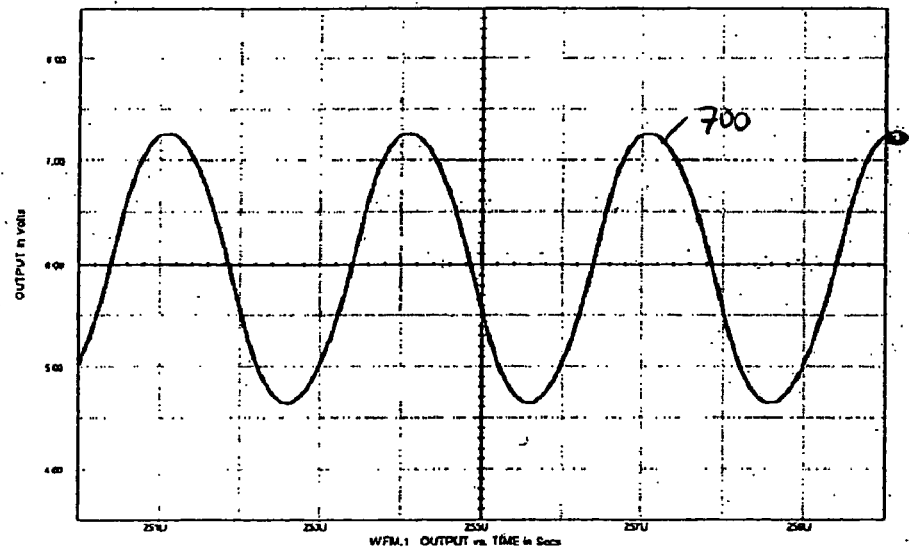
FIG. 7 is a voltage v. time graph of the output voltage waveform produced by a prior art class-S modulator.
Figure 8:
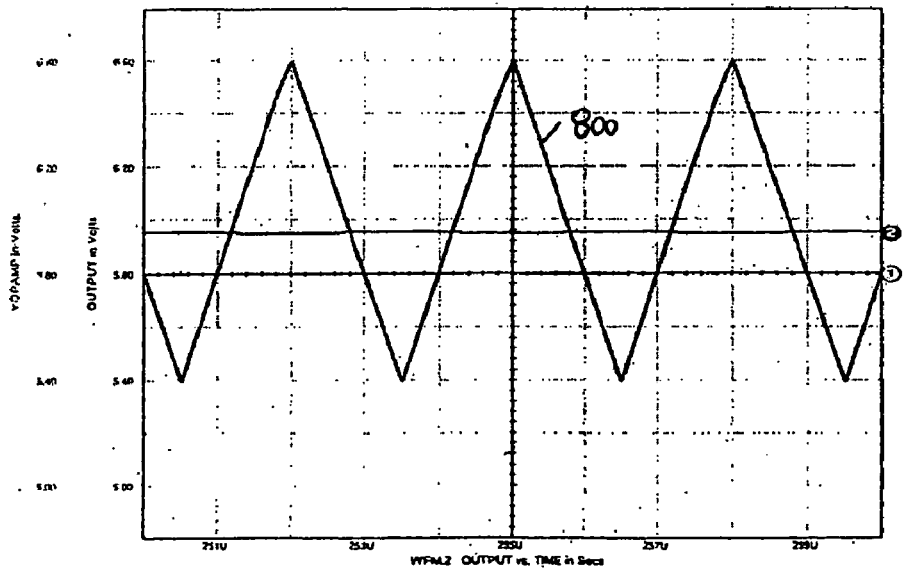
FIG. 8 is a voltage v. time graph of the output voltage waveform produced by the hybrid class-S modulator shown in FIG. 5.

FIGS. 7 and 8 illustrate how the feed-forward circuit of the hybrid class-S modulator 50 in FIG. 5 helps to reduce ripple at the output of the modulator. FIG. 7 is a voltage v. time graph showing the output voltage waveform 700 of a prior art class-S modulator lacking any feed-forward correction. As can be seen, the output voltage waveform of the conventional class-S modulator has a peak-to-peak ripple of 2.63 V. FIG. 8 is a voltage v. time graph showing the output voltage waveform 800 of the hybrid class-S modulator shown in FIG. 5. Compared to the 2.63 V peak-to-peak ripple of the conventional class-S modulator, the output waveform of the hybrid class-S modulator has a ripple of only 6.05 mV peak-to-peak. This translates to greater than a 50 dB rejection of unwanted ripple.

Figure 9:
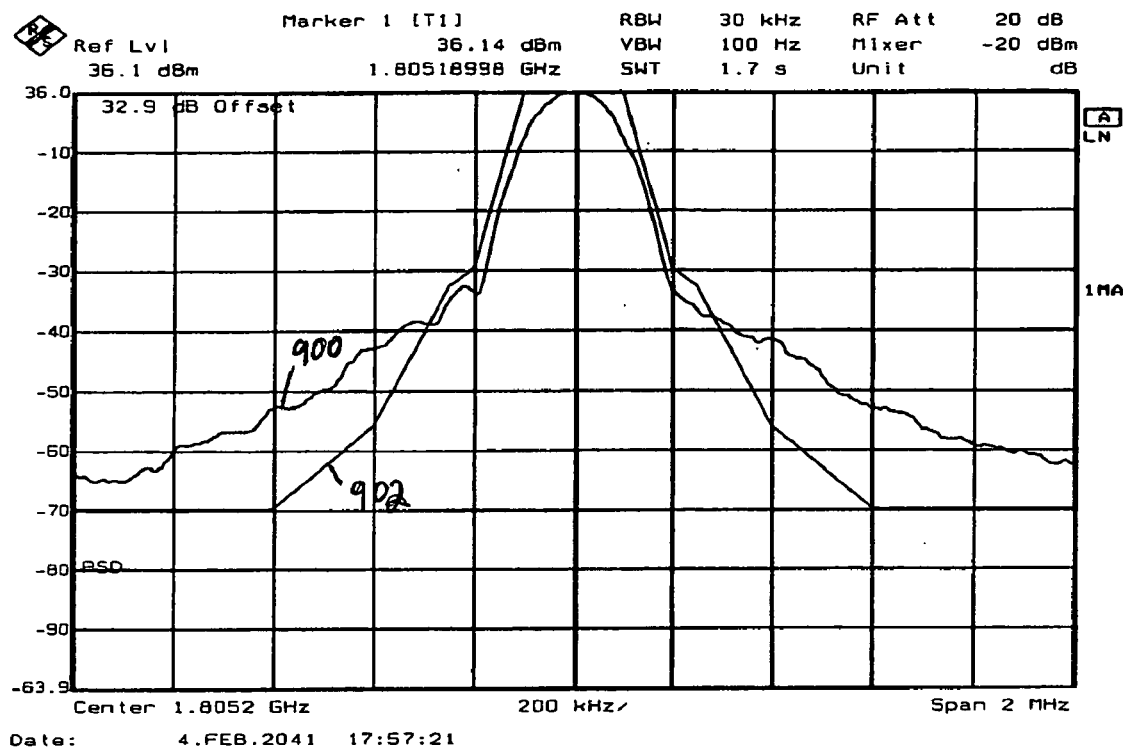
FIG. 9 is a power spectral density (PSD) performance plot, within a 2 MHz span, comparing the PSD of an EDGE modulated carrier produced by the prior art class-S modulator to the EDGE 20W specification.
Figure 10:
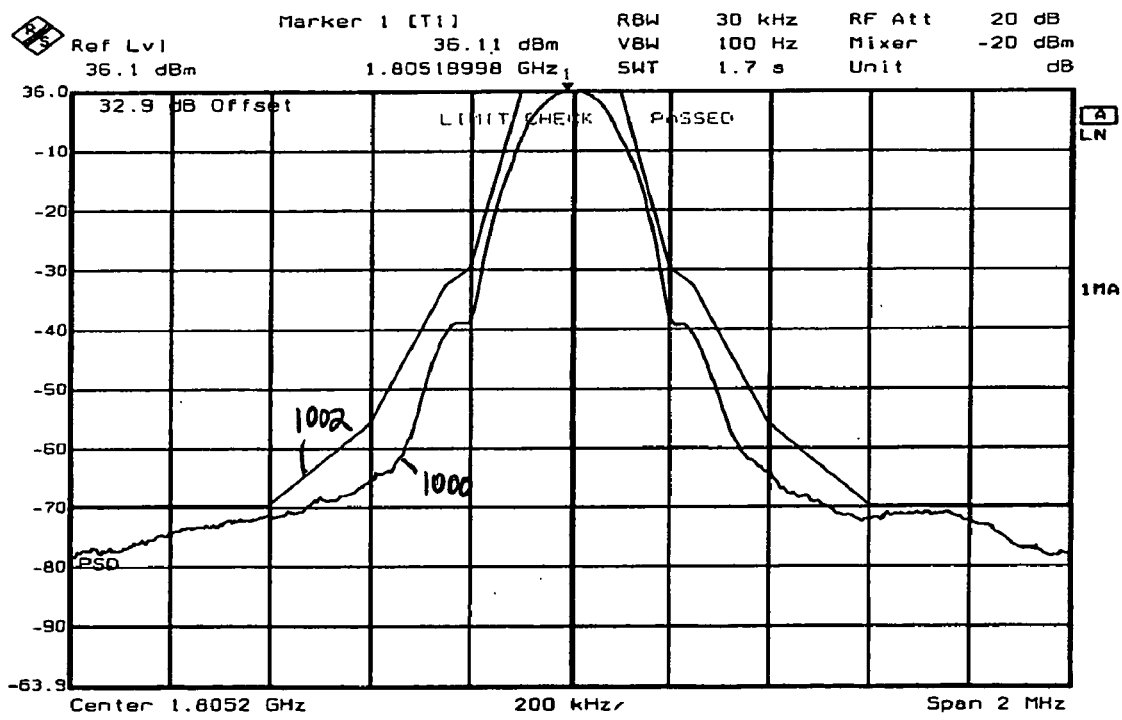
FIG. 10 is a power spectral density (PSD) performance plot, within a 2 MHz span, comparing the PSD of an EDGE modulated carrier produced by the hybrid class-S modulator in FIG. 5 to the EDGE 20W specification.
Figure 11:
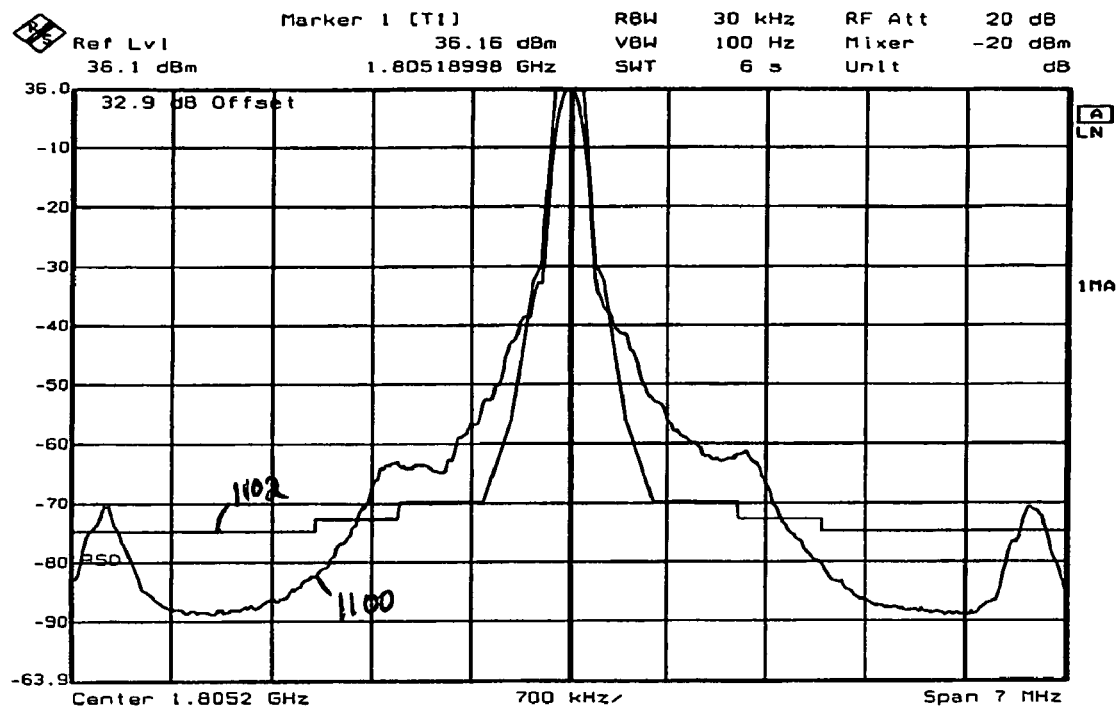
FIG. 11 is a power spectral density (PSD) performance plot, within a 7 MHz span, comparing the PSD of an EDGE modulated carrier produced by the prior art class-S modulator to the EDGE 20W specification.
Figure 12:
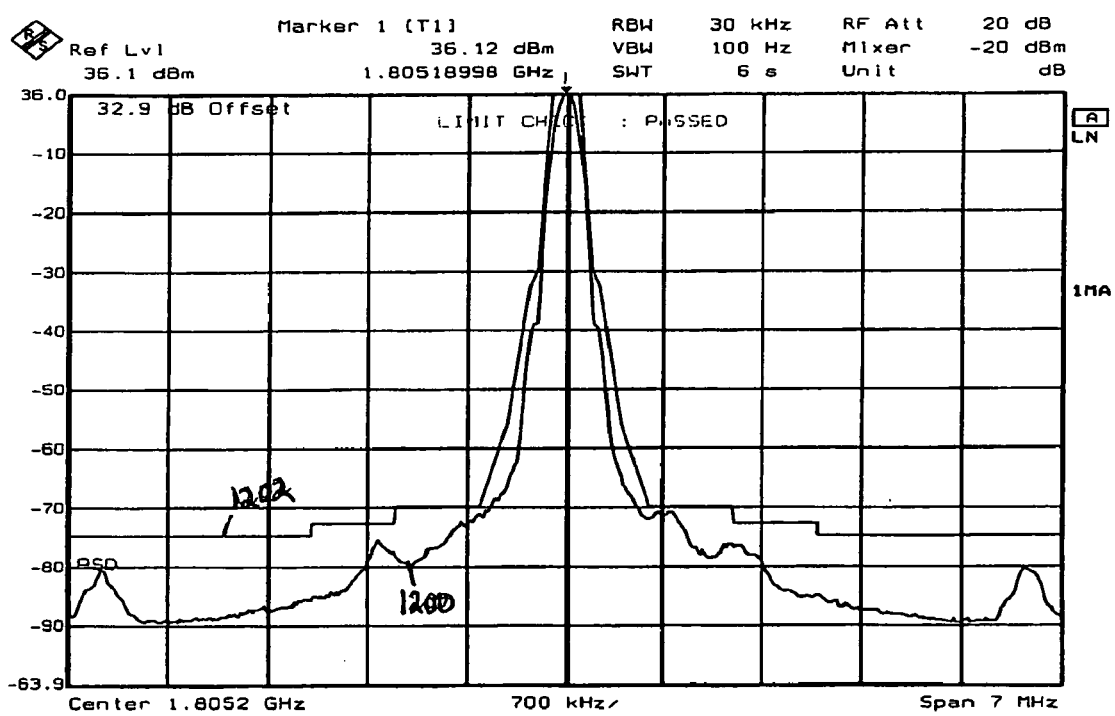
FIG. 12 is a power spectral density (PSD) performance plot comparing, within a 7 MHz span, the PSD of an EDGE modulated carrier produced by the hybrid class-S modulator in FIG. 5 to the EDGE 20W specification.

The effect of reducing the ripple in the output waveform can also be seen in the EDGE 20W PSD (power spectral density) performance plots in FIGS. 9 and 10. FIG. 9 shows the power spectral density (PSD) produced by the conventional class-S modulator in FIG. 4 for an EDGE modulated carrier centered at ~1.8 GHz. Compliance with the EDGE standard requires that the modulator output power 900 fall under the EDGE 20W PSD specification 902. Clearly, the specification is violated for frequencies that are more than about 300 kHz away from center frequency. By contrast, as shown in FIG. 10, the EDGE PSD plot 1000 for the hybrid class-S modulator in FIG. 5 completely falls beneath the maximum PSD EDGE specification 1002. Similar PSD curves are shown for a 7 Mhz span in FIGS. 11 and 12. Inspection of these PSD plots reveals that, while the PSD 1100 for the conventional class-S modulator again violates the EDGE specification 1602 for frequencies near the center frequency and frequencies approximately +/−3 MHz from the center frequency, the PSD plot 1200 for the hybrid class-S modulator is in full compliance with the EDGE PSD specification 1202.

Figure 13:
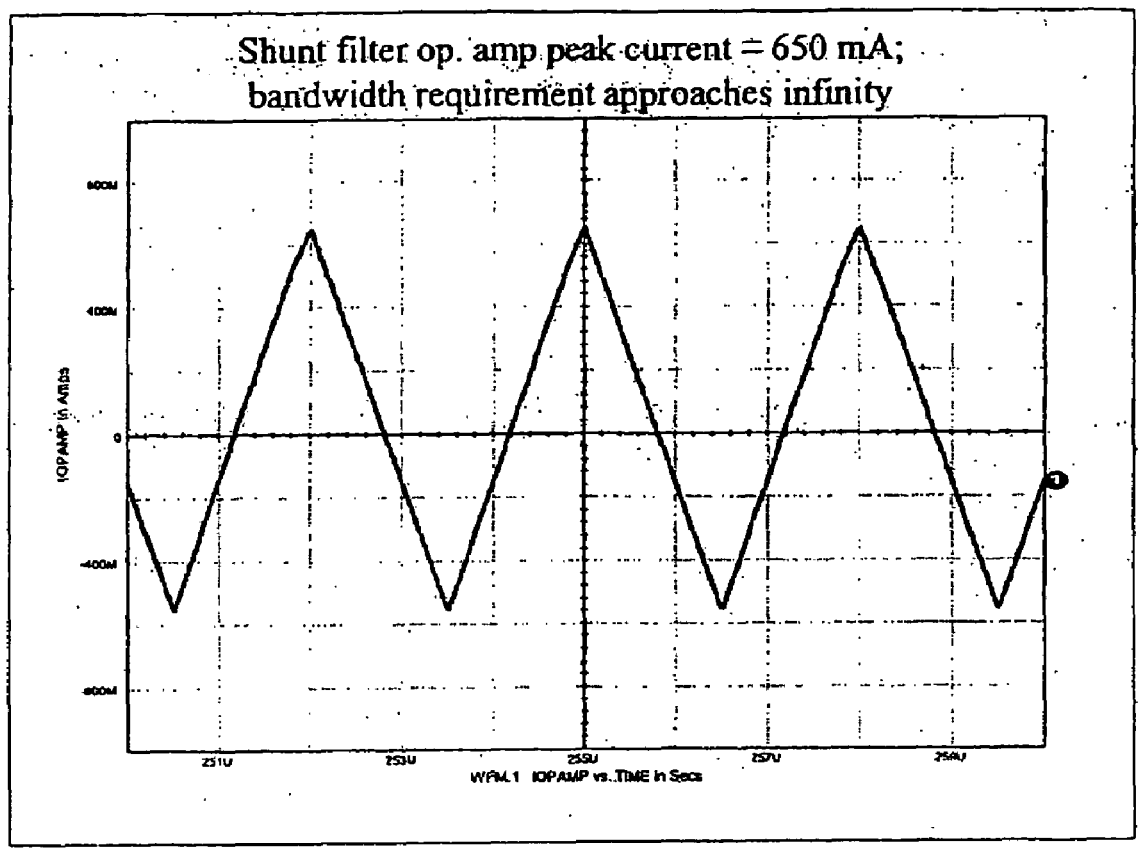
FIG. 13 is a current v. time graph showing the peak current supplied by the op-amp of the feed-forward path of the hybrid class-S modulator in FIG. 5.

The presence of the op-amp 514 in the feed-forward path of the hybrid class-S modulator 50 in FIG. 5 adds to the overall power consumption of the modulator. However, the additional power consumption is small since the op-amp 514 is connected in parallel with the class-S path. In fact, the op-amp 514 only has to handle a worst case load voltage change of Vsupply/($2^K$). For K=7 (following the example above) and a typical equivalent resistive load of 5 Ω at 20 V, this means that in order to change the output of the modulator from 20.00 to 20.20 V, the maximum amount of current the op-amp 514 must supply is (20.20-20.00)V/5 Ω=40 mA. FIG. 13 is a current v. time graph showing that the peak current supplied by the op-amp 514 is 650 mA. The peak current is greater than the 40 mA theoretical current due to the op-amp quiescent current and the slight mismatch of the gain between the op-amp 514 the class-S branch.)

Figure 1:
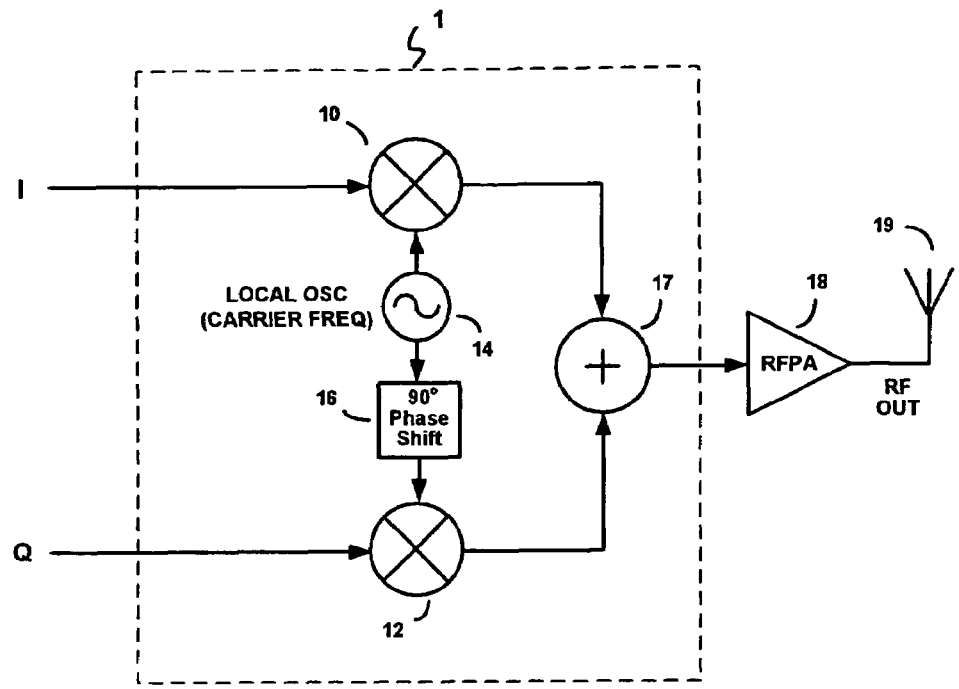
FIG. 1 is a block diagram of a prior art quadrature modulator.
Figure 2:
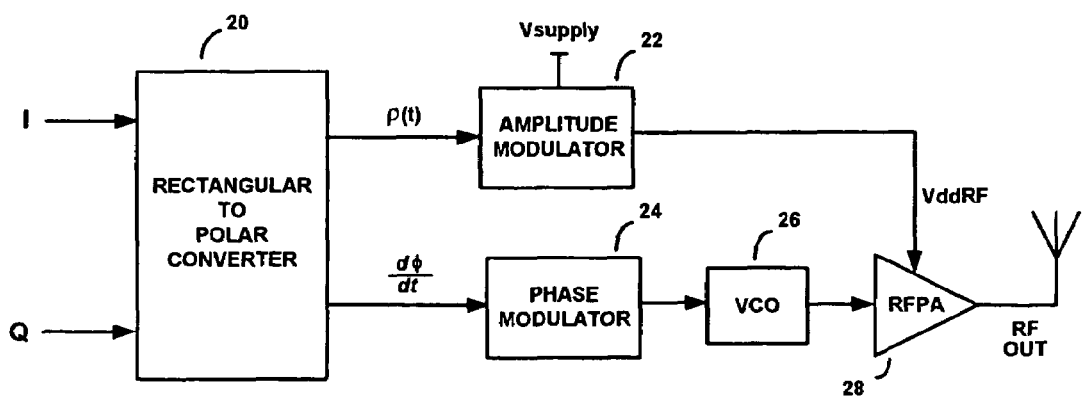
FIG. 2 is a block diagram of a prior art polar modulator.
Figure 3:
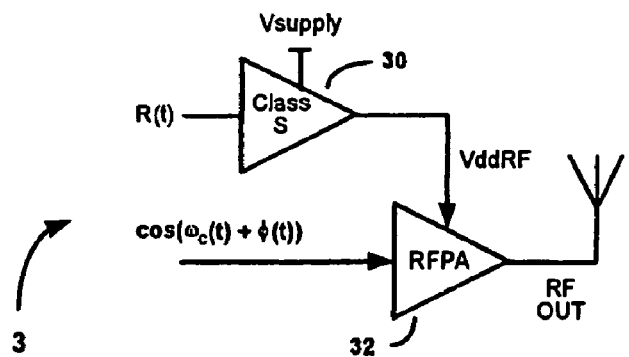
FIG. 3 is a block diagram of a polar modulator employing a class-S modulator in the amplitude path of the polar modulator.
Figure 4:
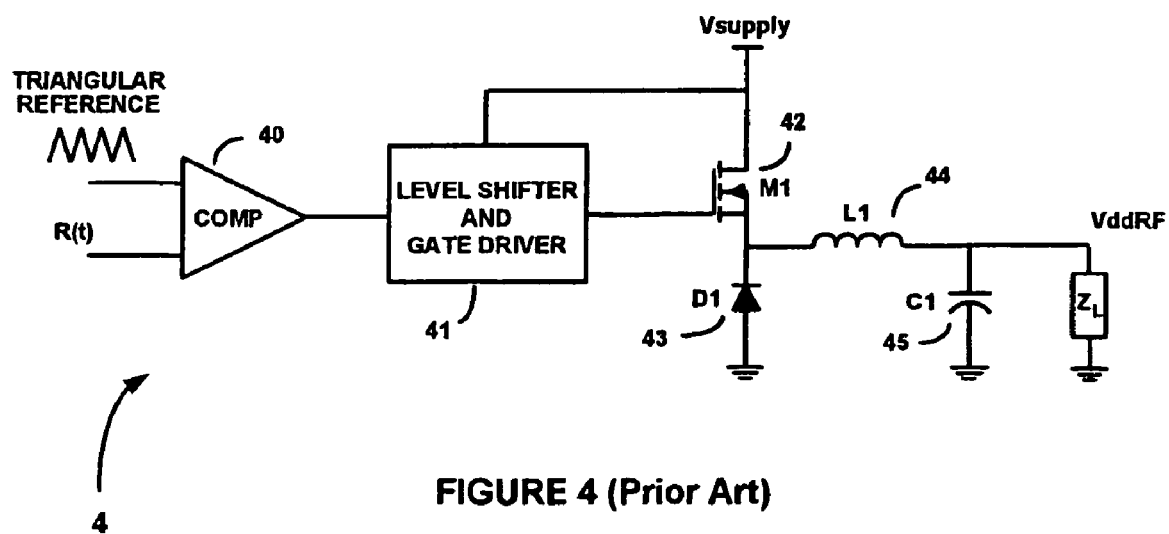
FIG. 4 is a block diagram of a conventional class-S modulator.

Although addition of the feed-forward path circuitry in the hybrid class-S modulator 50 in FIG. 5 results in an increase in power consumption compared to the conventional class-S modulator in FIG. 4, the increase in PAE (power added efficiency) gained by the ability to use the class-S modulator for EDGE type signals, instead of a linear modulator, more than makes up for the added feed-forward path power consumption. Indeed, simulations have shown that the PAE for the hybrid class-S modulator 50 in FIG. 5 can exceed 35%, while a conventional linear modulator approach has a PAE of only about 20%.

Figure 14:
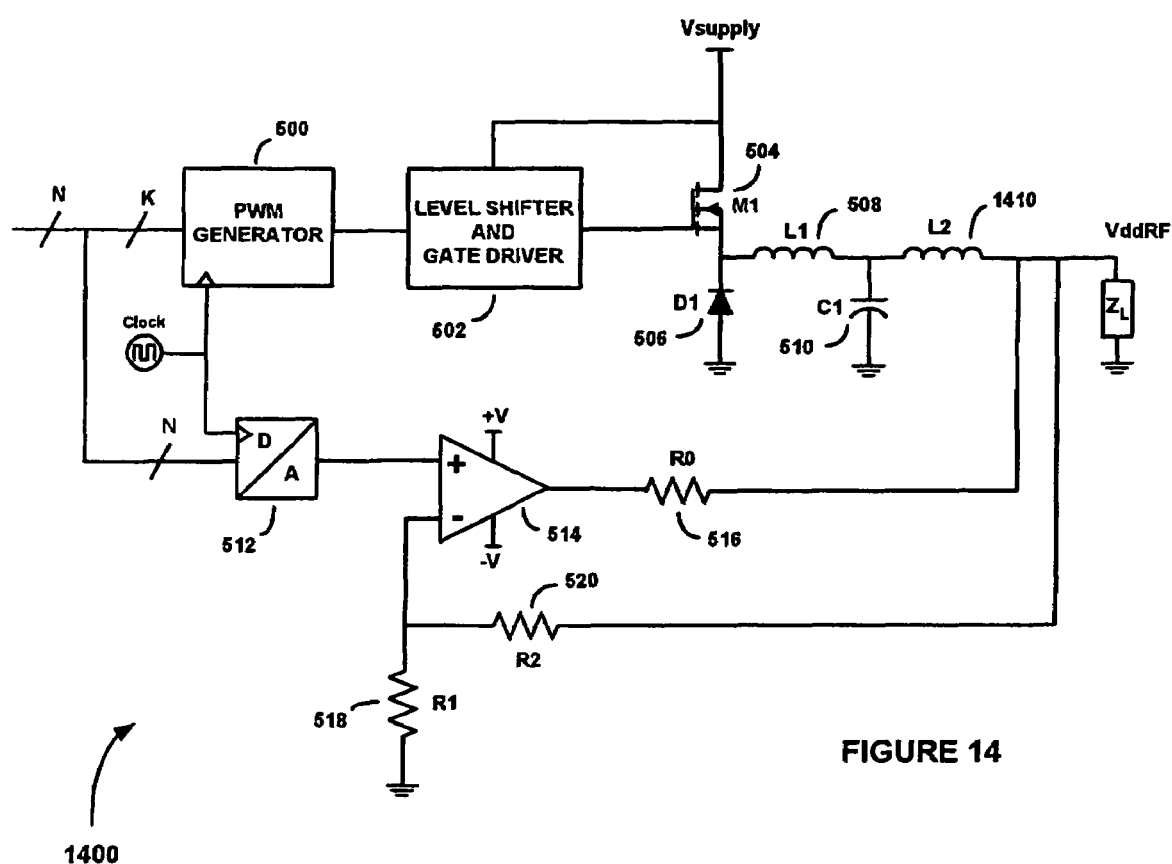
FIG. 14 is a diagram of a hybrid two-inductor class-S modulator, according to an embodiment of the present invention.

The ripple reducing effect of the hybrid class-S modulator in FIG. 5 can be further enhanced by using a two-inductor filter configuration, as illustrated in the hybrid class-S modulator 1400 shown in FIG. 14, which represents an alternative embodiment of the present invention. This hybrid class-S modulator 1400 is similar to the hybrid class-S modulator 50 in FIG. 5, but includes an additional inductor 1410 coupled between the buck converter LPF and the modulator output.

Figure 15:
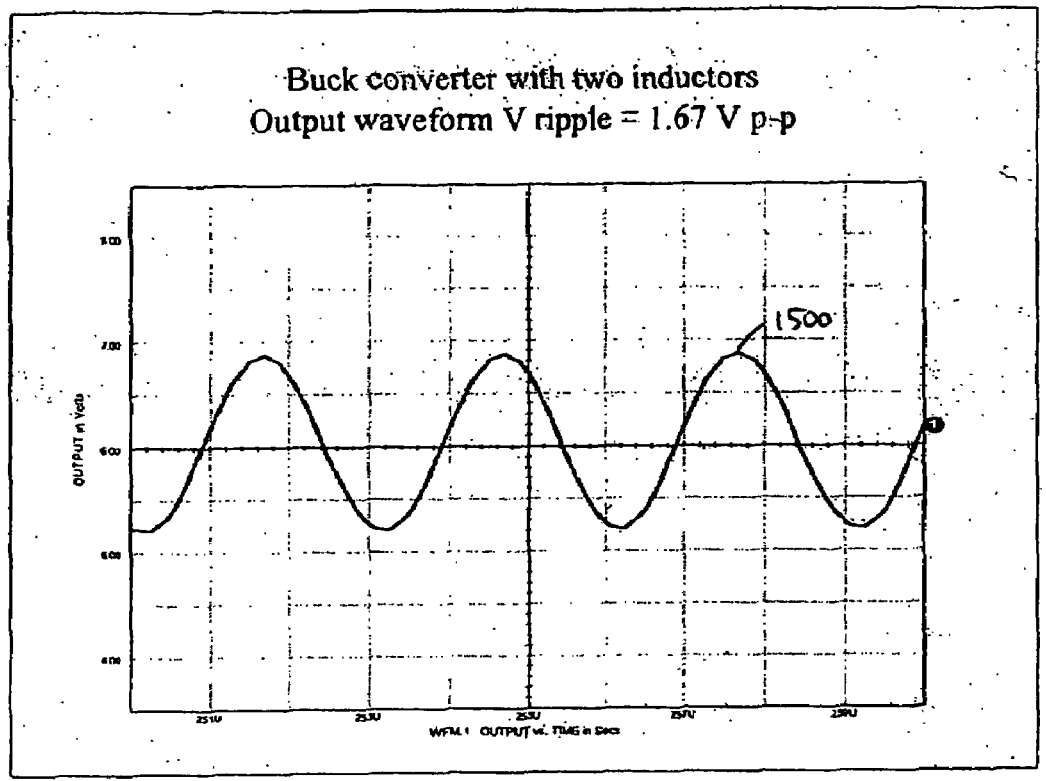
FIG. 15 is a voltage v. time graph of the output voltage waveform produced by a prior art two-inductor class-S modulator lacking any feed-forward correction.

FIG. 15 is a voltage v. time graph showing the output voltage waveform 1500 of a prior art class-S modulator lacking any feed-forward correction, but having a two-inductor buck converter output filter. Inspection of the graph reveals that the output voltage waveform of this two-inductor class-S modulator has a peak-to-peak ripple of 1.67 V.

Figure 16:
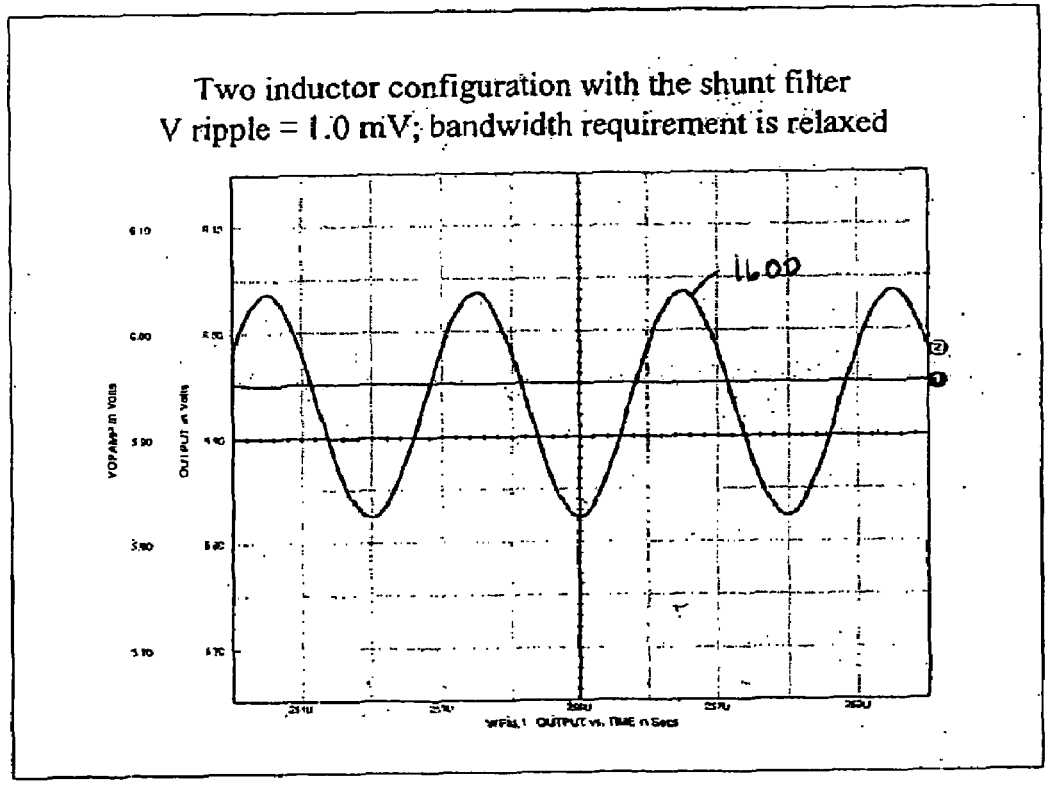
FIG. 16 is a voltage v. time graph of the output voltage waveform produced by the two-inductor hybrid class-S modulator in FIG. 14.

FIG. 16 is a voltage v. time graph showing the output voltage waveform 1600 of the hybrid class-S modulator 1400 shown in FIG. 14. Compared to the 1.67 V peak-to-peak ripple of the conventional class-S modulator (FIG. 15), the output waveform 1600 of the hybrid class-S modulator 1400 has a ripple of only 1.0 mV peak-to-peak. This translates to over a 60 dB rejection of unwanted ripple compared to the ~50 dB rejection for the single-inductor embodiment in FIG. 5.

Figure 17:
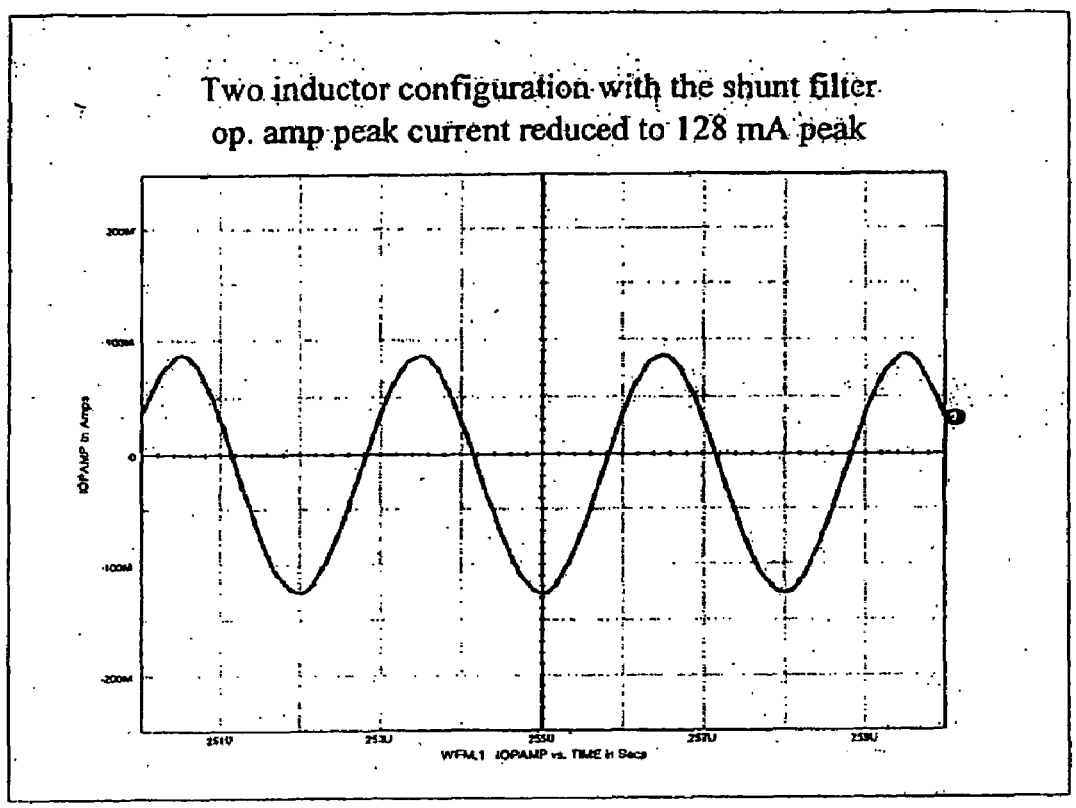
FIG. 17 is a current v. time graph showing the peak current supplied by the op-amp of the feed-forward path of the two-inductor hybrid class-S modulator in FIG. 14.

FIG. 17 shows the peak current required of the op-amp 514 for the two-inductor hybrid class-S modulator 1400 in FIG. 14. Compared to the 650 mA peak current required of the op-amp 514 in the single-inductor hybrid class-S modulator 50 in FIG. 5, the peak current supply required of the op-amp 514 in the two-inductor hybrid class-S modulator 1400 is only 128 mA. Hence, in addition to enhanced ripple reduction, the two-inductor hybrid class-S modulator 1400 is characterized by an enhanced PAE.

Figure 18:
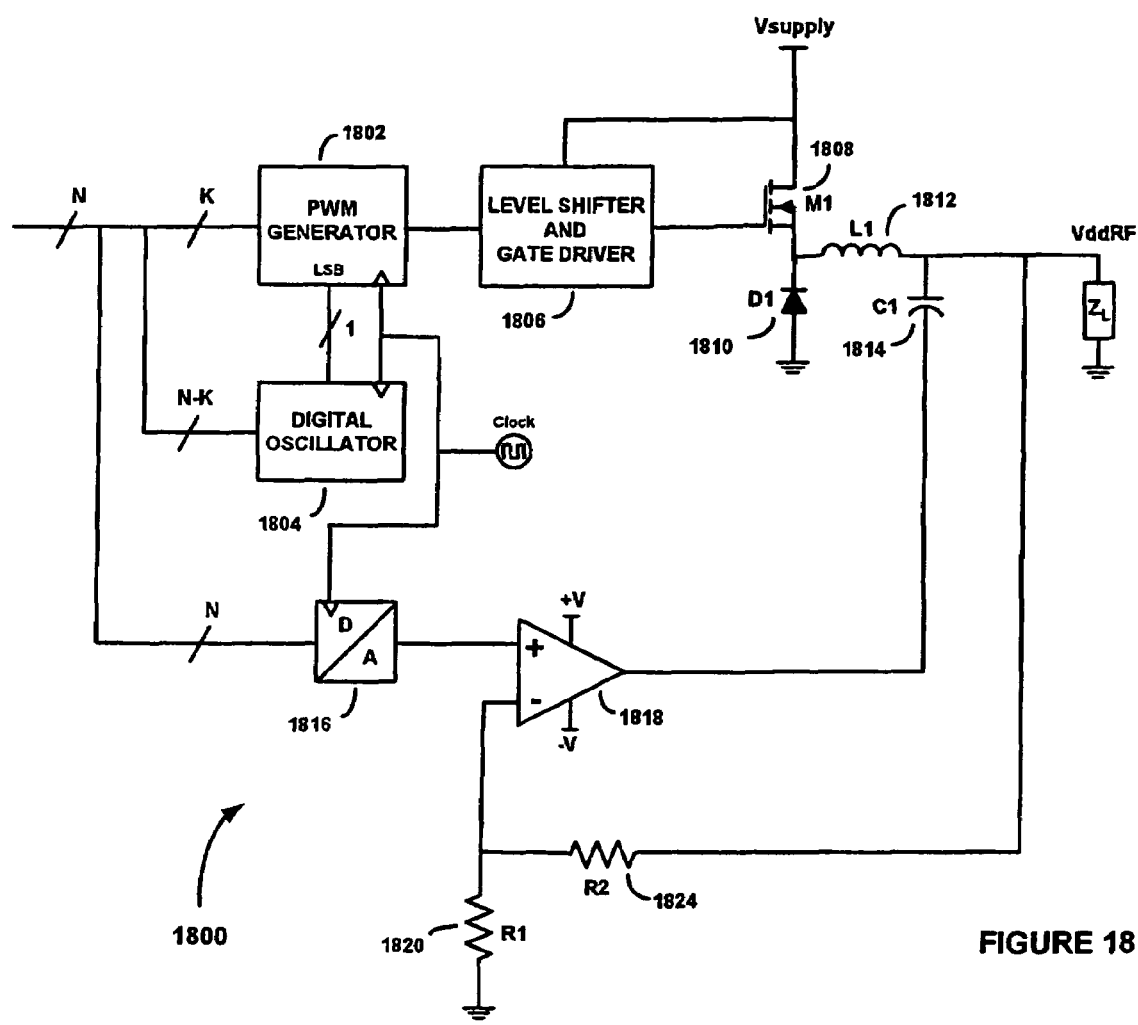
FIG. 18 is a diagram of a hybrid class-S modulator that interpolates the modulator output levels by dithering the input drive to the modulator buck converter, according to an embodiment of the present invention.

Referring next to FIG. 18, there is shown a hybrid class-S modulator 1800, according to another embodiment of the present invention. Similar to the hybrid class-S modulator 50 in FIG. 5, the hybrid class-S modulator 1800 comprises a modulator path and a feed-forward path. The modulator path includes a digital PWM generator 1802, a digital oscillator 1804, a level shifter and gate driver 1806, and a buck converter that includes a switching transistor 1808, a diode 1810, an inductor 1812 and a capacitor 1814 having a first terminal coupled to the modulator output and a second terminal. The feed-forward path includes a DAC 1816, an op-amp 1818, a first resistor 1820 coupled between the inverting input of the op-amp 1818 and ground, and a second resistor 1824 coupled between the inverting input of the op-amp output and ground.

The upper K bits of each N-bit input word (N and K are positive integers and N>K) are coupled to the input of the PWM generator 1802. This provides the PWM generator 1802 the capability of generating PWM output signals representing $2^K$ discrete voltage values. Because K<N, however, an error equal to the difference between the desired N-bit value and the K-bit values is presented to the PWM generator 1802.

According to this embodiment, the error generated by only using K of the N bits of each N-bit word applied to the PWM generator 1802 is reduced by dithering the input drive and converting the error to an AC signal. As shown in FIG. 18, the N−K least significant bits (LSBs) of each N-bit input word are fed to the input of the digital oscillator 1804, while the K most significant bits (MSBs) of each word are fed to the PWM generator 1802. The N−K bits of each N-bit word represent the error resulting from using only K of the N bits at the PWM generator 1802. The digital oscillator converts the N−K LSBs of each input word into an oscillating single LSB. This oscillating LSB has a duty cycle, D, where 0<D<1. The DC average of the output of the modulator is then a factor of D between its value for LSB=0 and LSB=1. Accordingly, the error caused by using only K bits of the N-bit input data words is converted essentially into an AC signal.

By dithering the input drive, an AC signal representing the error is generated and appears at the output of the modulator. This oscillating error signal is fed to the inverting input of the op-amp 1818. The desired output voltage, which is represented by the full N bits of the N-bit input words, is coupled to the non-inverting input of the op-amp 1818. With these signals at the op-amp inputs, the op-amp 1818 sources or sinks current into or out of the modulator output terminal to remove the error attributable to only using K of the N bits at the PWM generator 1802. Further, because the error has been converted to an AC signal, error correction can be performed by capacitively coupling the op-amp output to the modulator output via capacitor 1814.

Figure 19:
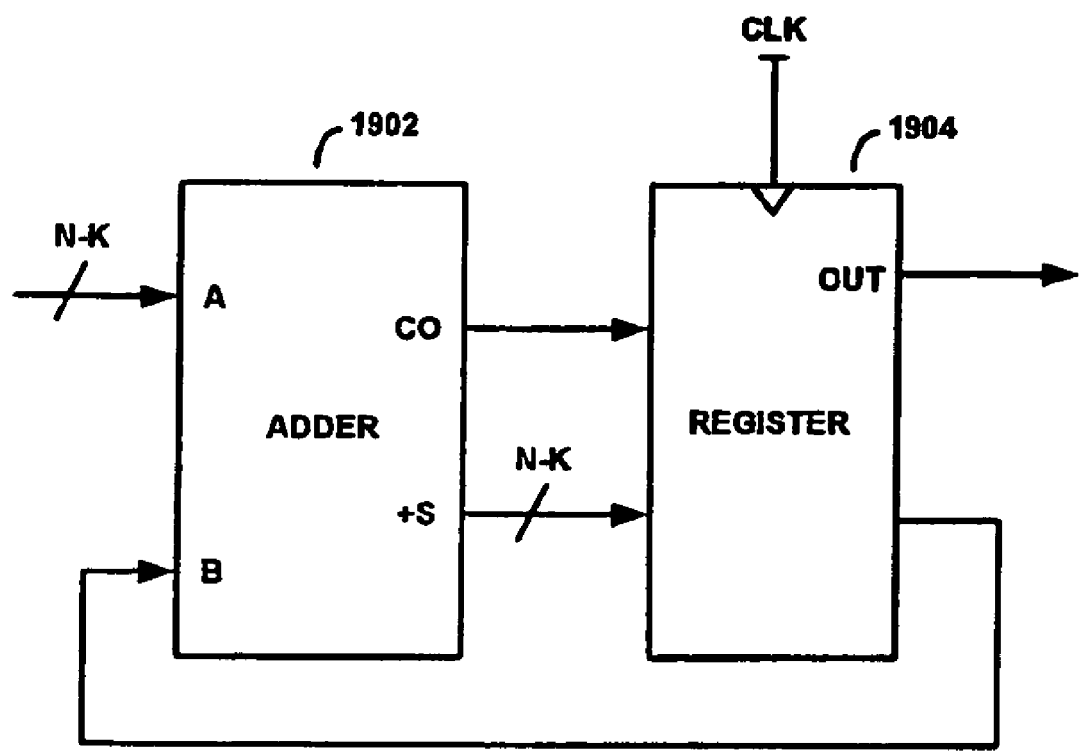
FIG. 19 is a diagram of an exemplary digital oscillator that may be used in the hybrid class-S modulator in FIG. 18.

The digital oscillator 1804 in the hybrid class-S modulator 1800 may be implemented in various ways. FIG. 19 show an exemplary direct digital synthesis (DDS) carry-out accumulator 1900, which can be used to implement the digital oscillator 1804. The accumulator 1900 comprises an adder 1902 and an M-bit register 1904, where M is an integer and $2^M$ is greater than the maximum possible value of the N−K bit word.

During operation, a N−K bit word is applied to a first input (A) of the adder 1902 and its binary value is added to the binary value of the N−K word applied to a second input (B) of the adder 1902. The sum of these two binary words appears at the output (+S) of the adder 1902. The sum is clocked into the DATA input of the register 1904 on the next clock cycle of the system clock, fclk, and is also fed back to the second input B of the adder 1902. The adder 1902 then adds this fed back sum to the N–K bit word at the first input A of the adder 1902, to provide a new sum at the +S output. This new sum is clocked into the register 1904 on the next clock cycle of fclk, and is again fed back to the second input B of the adder, which adds the new sum to the N–K word at the first input A. The adder 1902 and register 1904 continue to operate in this manner until the cumulative sum exceeds $2^M-1$. When this condition occurs, the amount by which the sum exceeds $2^M-1$ is presented at the +S output and a logic high carry-out bit is generated, which appears at the CO output of the adder 1902. The carry-out bit is clocked into the register 1904 on the next clock cycle and is an indication that the accumulator 1900 has overflowed.

Following generating the carry-out bit, the adder 1902 adds the amount by which the previous sum exceeded $2^M-1$ (i.e., the value of the N–K bit word appearing at the +S output of the adder 1902) to the N–K word at the first input A of the adder 1902. The carry-out bit of the adder 1902 is also reset to a logic low state, and the accumulation process continues until the cumulative sum once again is greater than $2^M-1$, at which time the accumulator overflows to produce a logic high carry-out bit once again.

It can be shown that the carry-out bit of the accumulator 1900 is generated a rate of the value of (N–K) divided by $2^M$. This oscillating bit can be generated for each of the N-bit words appearing a the input of the modulator 1800 in FIG. 18 to produce an AC error signal, as described above.

Although preferred embodiments of the present invention have been described in detail, it should be understood that various changes, substitutions and alternations can be made without departing from the spirit and scope of the inventions as defined by the appended claims.

What is claimed is:

1. A method for amplitude modulating a power supply voltage signal, comprising:
   receiving N-bit digital information words from a digital information source, where N is positive integer;
   dithering the K most significant bits (MSBs) of the N-bit digital information words using the N–K least significant bits (LSBs) of the N-bit digital information words, to generate a sequence of dithered pulse-width modulated (PWM) signals, where K is a positive integer that is less than N;
   modulating a power supply voltage signal using the dithered PWM signals, to produce a modulated power supply voltage signal having an AC error signal; and
   combining an AC correction signal with the AC error signal to reduce the amplitude of the AC error signal.

2. The method of claim 1 wherein the AC error signal contains quantization errors defined by the N–K LSBs of the N-bit digital information words.

3. The method of claim 1 wherein dithering the K MSBs of the N-bit digital information words using the N–K LSBs of the N-bit digital information words comprises generating an oscillating LSB signal.

4. The method of claim 3 wherein the oscillating LSB signal has a duty cycle that is proportional to the quantization errors defined by the N–K LSBs of the N-bit digital information signals.

5. A method for amplitude modulating a power supply signal, comprising:
   receiving a sequence of N-bit digital words, where N is a positive integer;
   generating a series of pulse-width modulated (PWM) signals based on the K most significant bits (MSBs) of the N-bit digital words, where K is a positive integer and N>K;
   modulating a power supply signal based on the PWM signals, to provide a modulated power supply signal; and
   reducing quantization errors present in the modulated power supply signal by adding and subtracting an error correction signal to and from said modulated power supply signal.

6. The method of claim 5 wherein generating a series of PWM signals further comprises dithering the K MSBs of the N-bit digital words to produce a series of dithered PWM signals.

7. The method of claim 6 wherein modulating a power supply signal comprises modulating the power supply signal based on the dithered PWM signals.

8. The method of claim 7 wherein modulating the power supply signal based on the dithered PWM signals generates a quantized modulated power supply signal that includes an AC ripple signal, and the method further comprises adding and subtracting an AC correction signal to and from the AC ripple signal to reduce the amplitude of the AC ripple signal in the quantized modulated power supply signal.

9. The method of claim 6 wherein dithering the K MSBs of the N-bit digital words comprises dithering the K MSBs of the N-bit digital words using the N–K LSBs of the N-bit digital words.

10. The method of claim 9 wherein dithering the K MSBs of the N-bit digital words using the N–K LSBs of the N-bit digital words comprises generating an oscillating LSB signal from the N–K LSBs of the N-bit digital words.

11. The method of claim 10 wherein said oscillating LSB signal has a duty cycle that is proportional to the quantization errors defined by the N–K LSBs of the N-bit digital information signals.

12. A modulator circuit, comprising:
   a pulse-width modulator configured to receive the K most significant bits (MSBs) of a sequence of N-bit digital words, where N and K are positive integers and N>K, and provide a series of pulse-width modulated signals;
   a buck converter configured to receive a power supply voltage signal and said pulse-width modulated signals, said buck converter operable to provide a quantized amplitude modulated power supply voltage signal; and
   a quantization error correction circuit coupled in parallel with said buck converter, said quantization error correction circuit operable to source or sink current into or out of an output node of the buck converter when magnitudes of the modulated power supply voltage signal are greater than or less than desired magnitudes defined by the N-bit digital words.

13. The modulator circuit of claim 12, further comprising an oscillator configured to receive the N–K least LSBs of the sequence of N-bit digital words and provide an oscillating LSB signal to the pulse-width modulator.

14. The modulator circuit of claim 13 wherein the oscillating LSB signal is used to dither the K MSBs of said sequence of N-bit digital words, to provide dithered pulse-width modulated signals.

15. The modulator circuit of claim 14 wherein the buck converter is operable to provide a quantized amplitude modulated power supply voltage signal that includes an AC ripple signal representing quantization errors.

16. The modulator circuit of claim 15 wherein said quantization error correction circuit is operable to source or sink current into or out of the output node of the buck converter to reduce the amplitude of the AC ripple signal.

17. A modulator circuit, comprising:
means for generating a series of pulse-width modulated (PWM) signals based on the K most significant bits (MSBs) of a sequence of N-bit digital words, where K and N are positive integers and N>K;
means for modulating a power supply signal based on the PWM signals, to provide a modulated power supply signal; and
means for reducing quantization errors present in the modulated power supply signal by adding and subtracting an error correction signal to and from said modulated power supply signal.

18. The modulator circuit of claim 17, further comprising means for dithering the K MSBs of the N-bit digital words to produce a series of dithered PWM signals.

19. The modulator circuit of claim 18 wherein said means for dithering the K MSBs of the N-bit digital words farther comprises dithering the K MSBs of the N-bit digital words using the N–K least significant bits (LSBs) of the N-bit digital words.

20. A modulator circuit, comprising:
a modulator operable to modulate a power supply signal according to an input signal and provide a modulated power supply signal at an output of said modulator; and
a circuit having an output that is directly or capacitively coupled to the output of said modulator, said circuit operable to reduce modulation errors in the modulated power supply signal,
wherein the modulated power supply signal provided by said modulator is not passed through a power dissipating regulator to reduce said modulation errors.

21. The modulator circuit of claim 20 wherein said modulator comprises a pulse-width modulator and a buck converter, said buck converter configured to receive said power supply signal and said pulse width modulator configured to receive the K most significant bits (MSBs) of a sequence of N-bit digital words, where N and K are positive integers and N>K.

22. The modulator circuit of claim 21, further comprising an oscillator configured to receive the N–K least significant bits (LSBs) of the sequence of N-bit digital words and provide an oscillating LSB signal to said pulse-width modulator.

23. The modulator circuit of claim 21, further comprising circuitry to dither the K MSBs of the sequence of N-bit digital words.

24. The modulator circuit of claim 23 wherein said pulse-width modulator is configured to receive dithered pulse-width modulated signals, and said buck converter is operable to provide a quantized amplitude modulated power supply signal having an AC ripple signal representing quantization errors, and said error correction circuit is operable to reduce the amplitude of the AC ripple signal provided by said buck converter by adding and subtracting an AC correction signal to the AC ripple signal provided by said buck converter.

25. The modulator circuit of claim 20 wherein said circuit further has an input coupled to an input of said modulator.

26. The modulator circuit of claim 20 wherein said circuit comprises an amplifier operable to source current to the output of said modulator when a signal level of said modulated power supply signal is less than a desired signal level and operable to sink current from the output of said modulator when a signal level of said modulated power supply signal is greater than a desired signal level.

27. The modulator circuit of claim 20 wherein said modulator comprises a class-S modulator.

28. The modulator circuit of claim 27 wherein said circuit comprises an amplifier operable to source current to the output of said modulator when a signal level of said modulated power supply signal is less than a desired signal level and operable to sink current from the output of said modulator when a signal level of said modulated power supply signal is greater than a desired signal level.

29. A modulator circuit, comprising:
a modulator operable to modulate a power supply signal according to an input signal and provide a modulated power supply signal; and
a circuit coupled to said modulator, said circuit operable to reduce errors present in the modulated power supply signal by adding or subtracting an error correction signal to or from the modulated power supply signal.

30. The modulator circuit of claim 29 wherein said circuit further has an input node to an input of said modulator.

31. The modulator circuit of claim 29 wherein said circuit comprises an amplifier operable to source current to the output of said modulator when signal level of said modulated supply signal is less than a desired signal level and operable to sink current from the output of said modulator when a signal level of said modulated supply signal is greater than a desired signal level.

32. The modulator circuit of claim 29 wherein said modulator comprises a class-S modulator.

33. The modulator circuit of claim 32 wherein said circuit comprises an amplifier operable to source current to the output of said modulator when a signal level of said modulated supply signal is less than a desired signal level and operable to sink current from the output of said modulator when a signal level of said modulated supply signal is greater than a desired signal level.

34. The modulator circuit of claim 29 wherein said modulator comprises a digital pulse-width modulator (PWM) generator configured to receive digital input data and said modulator is operable to generate a modulated power supply signal having a plurality of quantized signal levels with magnitudes depending on pulse widths of PWM signals generated by said PWM generator.

35. The modulator circuit of claim 34 wherein said circuit comprises an amplifier operable to source current to the output of said modulator when a magnitude of a quantized signal level of said plurality of quantized signal levels is less than a desired magnitude, and operable to sink current from the output of said modulator when a magnitude of a quantized signal level of said plurality of said quantized signal levels is greater than a desired magnitude.

36. A method of enhancing the linearity of a class-S modulator, comprising:
modulating a power supply voltage depending on the amplitude of an input signal, to produce a modulated power supply voltage signal across an output load; and
adding current to an output node of the load when a voltage level of the modulated power supply voltage signal is less than a desired voltage level and subtracting current from the output node when a voltage level of the modulated power supply voltage signal is greater than a desired voltage level.

37. The method of claim 36, further comprising:
generating a pulse-width modulated (PWM) signal from said input signal; and
using said PWM signal to produce said modulated power supply voltage signal.

38. The method of claim 37 wherein:
the input signal comprises a digital input signal;

generating said PWM signal comprises generating one or more discrete PWM modulated signals; and modulating the power supply voltage comprises modulating the power supply voltage signal depending on the pulse widths of the one or more discrete PWM modulated signals.

39. The method of claim 38, further comprising adding current to the output node of the load when a quantized level of the modulated power supply voltage is less than a desired output voltage level and subtracting current from the output node of the load when a quantized level of the modulated power supply voltage is greater than a desired output voltage level.

40. A modulator circuit, comprising:
an input port configured to receive a succession of N-bit digital words, where N is an integer that is greater than one;
a modulator configured to modulate a power supply signal according to values represented by the K most significant bits of each N-bit digital word, where K is a positive integer that is less than N;
an output port adapted to provide a modulated power supply signal; and
a circuit coupled to said modulator, said circuit operable to reduce deviations of signal levels of said modulated power supply signal from desired signal levels without any need for a power dissipating regulator between said modulator and said output port.

41. The modulator circuit of claim 40 wherein said modulator comprises a pulse-width modulator (PWM) generator configured to receive the K most significant bits of each N-bit digital word and generate a modulated power supply signal having a plurality of quantized signal levels depending on pulse widths of PWM signals generated by said PWM generator.

42. The modulator circuit of claim 41 wherein said deviation of signal levels of the modulated power supply signal from desired signal levels depend, at least in part, on the difference in value of an N-bit word received at said input port and the value of the K most significant bits of the N-bit word applied to said PWM generator.

43. A modulator circuit, comprising:
a modulator having an input configured to receive an approximated input signal and operable to modulate a power supply signal according to the approximated input signal to generate a modulated power supply signal at an output of said modulator; and
a correction circuit having an output that is directly or capacitively coupled to the output of said modulator, said correction circuit operable to reduce an error in the modulated power supply signal caused by modulating the power supply signal according to said approximated input signal.

44. A modulator circuit, comprising:
a modulator having an input configured to receive amplitude information of an information signal and generate a modulated power supply signal according to the amplitude information;
a circuit coupled to said modulator, said circuit operable to source or sink current to or from an output node of said modulator when signal levels of the modulated power supply signal are less than or greater than desired signal level; and
an amplifier having a power supply terminal configured to receive the modulated power supply signal.

45. The polar modulator circuit of claim 44 wherein said modulator comprises a class-S modulator.

46. The polar modulator circuit of claim 44 wherein said modulator comprises a digital pulse-width modulator (PWM) generator configured to receive digital input data and said modulator is operable to generate a modulated power supply signal having a plurality of quantized signal levels with magnitudes depending on pulse widths of PWM signals generated by said PWM generator.

47. A modulator circuit, comprising:
means for modulating a power supply signal depending on the amplitude of an input signal, to produce a modulated power supply signal; and
means for adding or subtracting current to or from an output node of said means for modulating, when a signal level of said modulated power supply signal is determined to be less than or greater than a desired signal level.

48. A modulation method, comprising:
modulating a power supply signal according to amplitude information of an amplitude modulation signal to generate an amplitude modulated power supply signal;
reducing the degree by which levels of the amplitude modulated power supply signal deviate from desired levels by adding and subtracting an error correction signal to and from said amplitude modulated power supply signal;
generating an angle-modulated signal from a constant-amplitude angle-modulation signal; and
amplifying and varying the amplitude of the angle-modulated signal according to said amplitude modulated power supply signal.

* * * * *

UNITED STATES PATENT AND TRADEMARK OFFICE
CERTIFICATE OF CORRECTION

PATENT NO. : 7,558,334 B2 Page 1 of 1
APPLICATION NO. : 11/515250
DATED : July 7, 2009
INVENTOR(S) : Earl W. McCune et al.

It is certified that error appears in the above-identified patent and that said Letters Patent is hereby corrected as shown below:

In the Claims
Claim 19, Col. 11, line 19, "farther" should read --further--.
Claim 31, Col. 12, line 21, "supply signal" should read --power supply signal--.
Claim 33, Col. 12, line 30, "supply signal" should read --power supply signal--.

Signed and Sealed this

Sixteenth Day of February, 2010

David J. Kappos
*Director of the United States Patent and Trademark Office*